(12) United States Patent
Yeh et al.

(10) Patent No.: US 11,509,296 B2
(45) Date of Patent: Nov. 22, 2022

(54) CLOCK GENERATOR FOR FREQUENCY MULTIPLICATION

(71) Applicant: NOVATEK Microelectronics Corp., Hsin-Chu (TW)

(72) Inventors: Che-Wei Yeh, Hsinchu (TW);
Keko-Chun Liang, Hsinchu (TW);
Yu-Hsiang Wang, Hsinchu (TW);
Yi-Chuan Liu, Hsinchu County (TW)

(73) Assignee: NOVATEK Microelectronics Corp., Hsin-Chu (TW)

(*) Notice: Subject to any disclaimer, the term of this patent is extended or adjusted under 35 U.S.C. 154(b) by 0 days.

(21) Appl. No.: 17/239,671

(22) Filed: Apr. 25, 2021

(65) Prior Publication Data

US 2022/0345123 A1    Oct. 27, 2022

(51) Int. Cl.
*H03K 5/156* (2006.01)
*G06F 1/06* (2006.01)
*H03K 5/133* (2014.01)
*H03K 5/00* (2006.01)
*H03K 5/135* (2006.01)

(52) U.S. Cl.
CPC ............. *H03K 5/1565* (2013.01); *G06F 1/06* (2013.01); *H03K 5/00006* (2013.01); *H03K 5/133* (2013.01); *H03K 5/135* (2013.01)

(58) Field of Classification Search
None
See application file for complete search history.

(56) References Cited

U.S. PATENT DOCUMENTS

| | | | |
|---|---|---|---|
| 9,344,074 B2 * | 5/2016 | Zerbe | ........................ H03K 5/14 |
| 2014/0035650 A1 * | 2/2014 | Zerbe | ................... H03K 3/0315 |
| | | | 327/299 |
| 2014/0125391 A1 * | 5/2014 | Seon | .................... H03K 5/1565 |
| | | | 327/175 |

* cited by examiner

*Primary Examiner* — Cassandra F Cox
(74) *Attorney, Agent, or Firm* — Winston Hsu

(57) ABSTRACT

A clock generator includes a pulse generator and a duty cycle correction circuit. The pulse generator is configured to receive an input clock signal and generate a pulse signal according to the input clock signal. The duty cycle correction circuit, coupled to the pulse generator, is configured to adjust a duty cycle of the pulse signal to generate an output clock signal.

16 Claims, 12 Drawing Sheets

CLOCK GENERATOR FOR FREQUENCY MULTIPLICATION

BACKGROUND OF THE INVENTION

1. Field of the Invention

The present invention relates to a clock generator, and more particularly, to a clock generator for frequency multiplication.

2. Description of the Prior Art

Conventionally, in the circuit system, a clock signal having a multiple frequency is usually generated through a phase-locked loop (PLL) or a delay-locked loop (DLL). The PLL is usually composed of a phase detector, charge pump, loop filter, voltage-controlled oscillator (VCO) and frequency divider, and the DLL is usually composed of a phase detector, charge pump, loop filter and voltage-controlled delay line. These circuit blocks are complex and usually require high power consumption and occupy large circuit area. Thus, there is a need to provide a novel clock generator capable of generating an output clock signal having a multiple frequency without the usage of PLL or DLL, so as to save power consumption and circuit area.

SUMMARY OF THE INVENTION

It is therefore an objective of the present invention to provide a clock generator for frequency multiplication, in order to solve the abovementioned problems.

An embodiment of the present invention discloses a clock generator, which comprises a pulse generator and a duty cycle correction circuit. The pulse generator is configured to receive an input clock signal and generate a pulse signal according to the input clock signal. The duty cycle correction circuit, coupled to the pulse generator, is configured to adjust a duty cycle of the pulse signal to generate an output clock signal.

Another embodiment of the present invention discloses a clock generator, which comprises a plurality of frequency doublers connected in series. Each of the frequency doublers comprises a pulse generator and a duty cycle correction circuit. The pulse generator is configured to receive an input clock signal and generate a pulse signal according to the input clock signal. The duty cycle correction circuit, coupled to the pulse generator, is configured to adjust a duty cycle of the pulse signal to generate an output clock signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
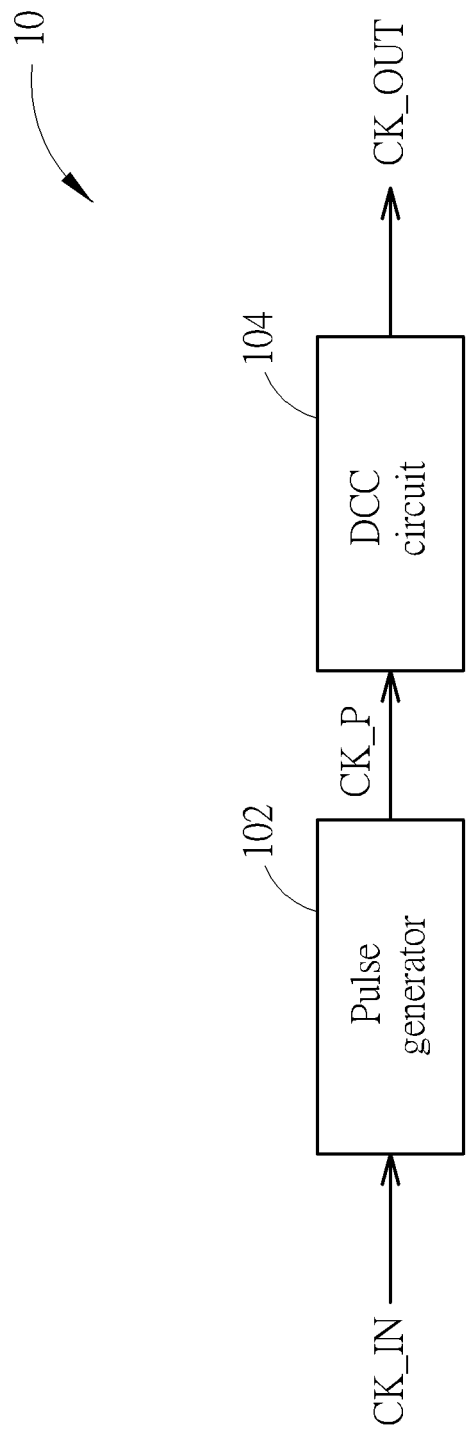
FIG. 1 is a schematic diagram of a clock generator according to an embodiment of the present invention.

Please refer to FIG. 1, which is a schematic diagram of a clock generator 10 according to an embodiment of the present invention. As shown in FIG. 1, the clock generator 10 includes a pulse generator 102 and a duty cycle correction (DCC) circuit 104. The pulse generator 102 is configured to receive an input clock signal CK_IN and generate a pulse signal CK_P according to the input clock signal CK_IN. The DCC circuit 104 is configured to receive the pulse signal CK_P from the pulse generator 102, and adjust the duty cycle of the pulse signal to generate an output clock signal CK_OUT.

Figure 2:
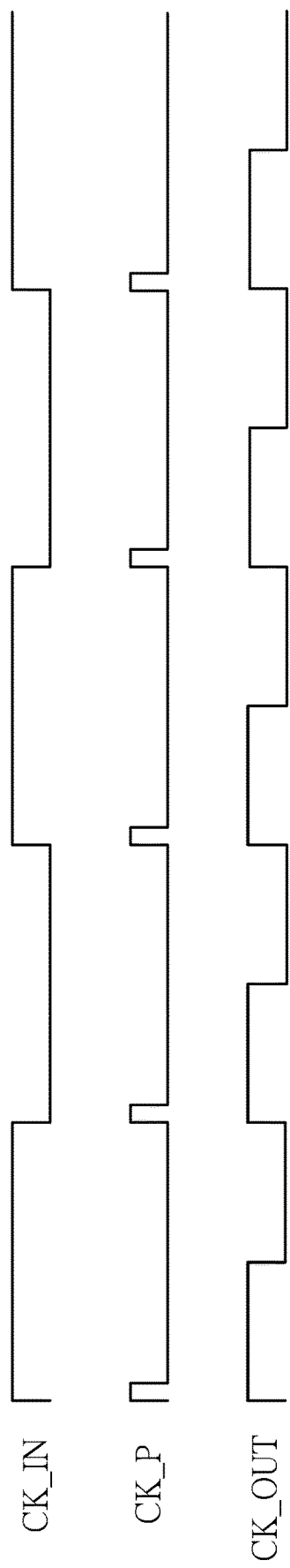
FIG. 2 is a waveform diagram of the signals of the clock generator as shown in FIG. 1.

FIG. 2 is a waveform diagram of the signals of the clock generator 10 as shown in FIG. 1, where the waveforms of the input clock signal CK_IN, the pulse signal CK_P and the output clock signal CK_OUT are illustrated. As shown in FIG. 2, the input clock signal CK_IN may have a duty cycle equal to 50%. The pulse signal CK_P includes a plurality of pulses, each generated at the transition time of the input clock signal CK_IN. After the pulse signal CK_P is generated, the duty cycle of the pulse signal CK_P may be adjusted or modified through the DCC circuit 104, so as to generate the output clock signal CK_OUT. The output clock signal CK_OUT may also have a duty cycle equal to 50%, and the frequency of the output clock signal CK_OUT is twice the frequency of the input clock signal CK_IN.

Therefore, the clock generator of the present invention may only include a pulse generator and a DCC circuit, which are much simpler than the circuit structure constructing the phase-locked loop (PLL) or the delay-locked loop (DLL). The proposed clock generator may also have the benefits of lower power consumption and smaller circuit area. For example, the voltage-controlled oscillator (VCO) or voltage-controlled delay line that may require a larger area may be omitted. Note that the frequency generated by the clock generator of the present invention is limited to a multiple of power of 2. For example, if the frequency of the input clock signal is 10 megahertz (MHz), the frequency of the generated output clock signal may be 20 MHz, 40 MHz, or 80 MHz, etc.

Figure 3:
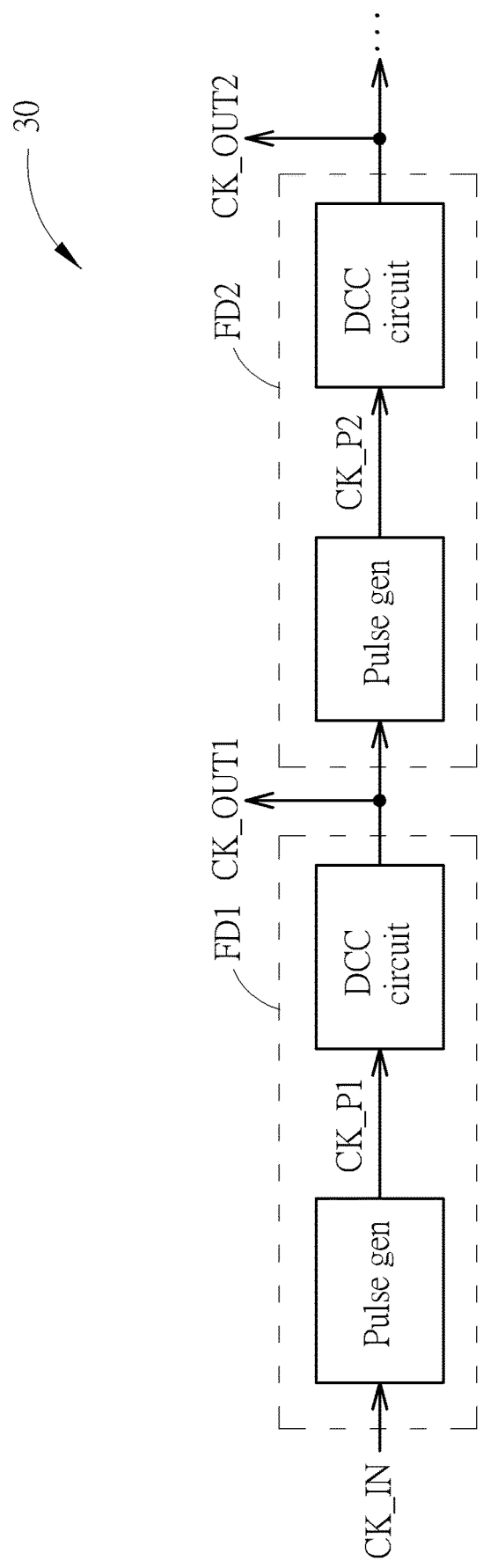
FIG. 3 is a schematic diagram of a clock generator according to an embodiment of the present invention.

In an embodiment, the circuit structure of the clock generator 10 may be duplicated and connected in series to generate output frequencies in more multiples. Please refer to FIG. 3, which is a schematic diagram of a clock generator 30 according to an embodiment of the present invention. As shown in FIG. 3, the clock generator 30 includes a plurality of frequency doublers FD1, FD2 . . . etc., where each frequency doubler has a circuit structure identical to the clock generator 10 as shown in FIG. 1. That is, each frequency doubler may include a pulse generator and a DCC circuit. A double frequency may be generated through one frequency doubler, a quadruple frequency may be generated through two frequency doublers, and an octuple frequency may be generated through three frequency doublers, and so on.

Figure 4:
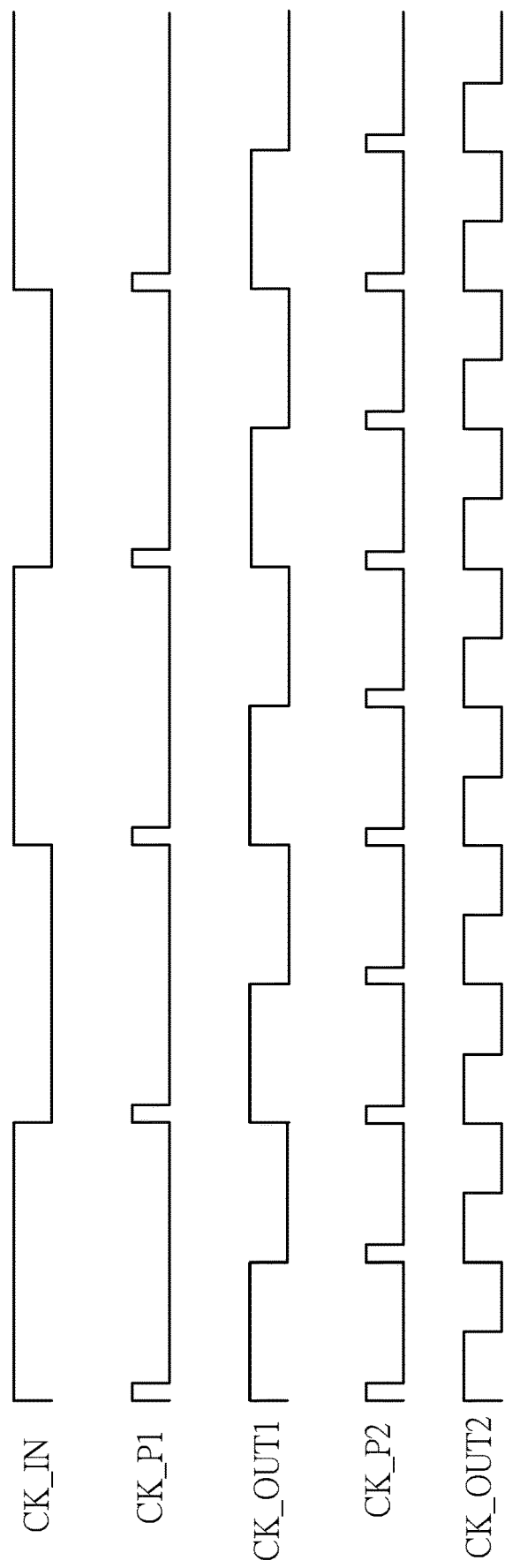
FIG. 4 is a waveform diagram of the signals of the clock generator as shown in FIG. 3.

FIG. 4 is a waveform diagram of the signals of the clock generator 30 as shown in FIG. 3, where the waveforms of the input clock signal CK_IN, the pulse signals CK_P1 and CK_P2, and the output clock signals CK_OUT1 and CK_OUT2 are illustrated. More specifically, the frequency doubler FD1 may generate the pulse signal CK_P1 and thereby generate the output clock signal CK_OUT1 having a double frequency by receiving the input clock signal CK_IN. The frequency doubler FD2 may generate the pulse signal CK_P2 and thereby generate the output clock signal CK_OUT2 having a quadruple frequency by receiving the output clock signal CK_OUT1.

Figure 5:
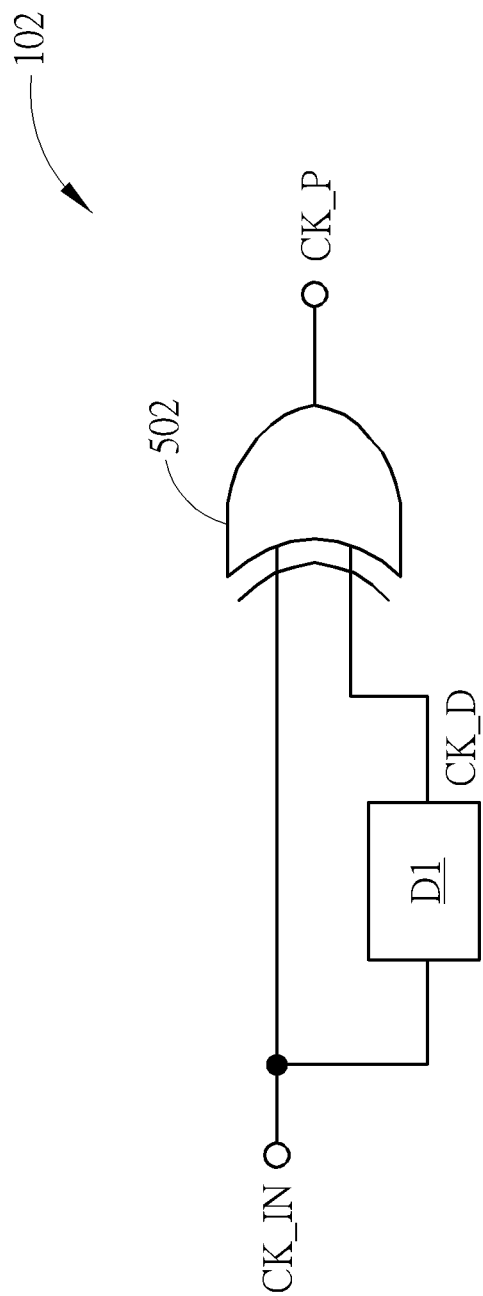
FIG. 5 illustrates a detailed implementation of the pulse generator.

In the clock generator of the present invention, the pulse generator and the DCC circuit may be implemented in various manners. Please refer to FIG. 5, which illustrates a detailed implementation of the pulse generator 102. As shown in FIG. 5, the pulse generator 102 includes a delay cell D1 and an Exclusive-OR gate 502. The delay cell D1 may receive the input clock signal CK_IN, and generate a delay on the input clock signal CK_IN to generate a delay signal CK_D. The input clock signal CK_IN and the delay signal CK_D are received by the Exclusive-OR gate 502; hence, the Exclusive-OR gate 502 may generate and output the pulse signal CK_P having multiple pulses at the transition time of the input clock signal CK_IN. Note that the interval of every two pulses in the pulse signal CK_P may substantially equal one half of the cycle of the input clock signal CK_IN.

Figure 6:
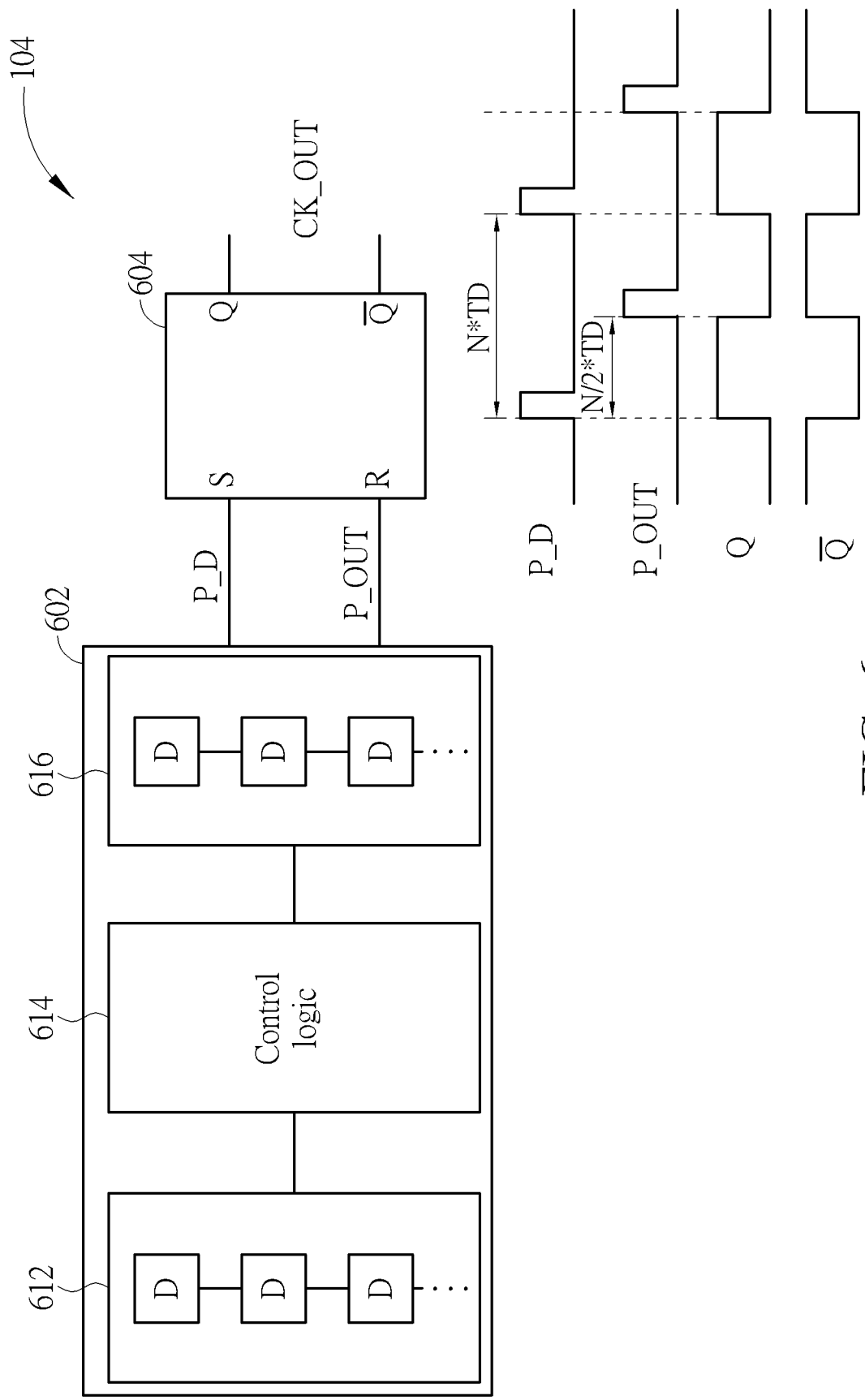
FIG. 6 illustrates a detailed implementation of the DCC circuit.

In an embodiment, the DCC circuit 104 may adjust the duty cycle of the pulse signal CK_P by detecting the interval length of every two pulses in the pulse signal CK_P. Please refer to FIG. 6, which illustrates a detailed implementation of the DCC circuit 104. As shown in FIG. 6, the DCC circuit 104 includes a pulse interval detector 602 and an S-R latch 604. The pulse interval detector 602 may receive the pulse signal CK_P and detect the interval length of two adjacent pulses in the pulse signal CK_P. The S-R latch 604 thereby generates the output clock signal CK_OUT according to the detection result of the pulse interval detector 602.

In detail, the pulse interval detector 602 may include a first delay circuit 612, a control logic 614 and a second delay circuit 616. Each of the first delay circuit 612 and the second delay circuit 616 may include a plurality of delay cells. Preferably, the delay time of the delay cells is configurable, allowing the delay circuits 612 and 616 to generate appropriate delay values.

Figure 7:
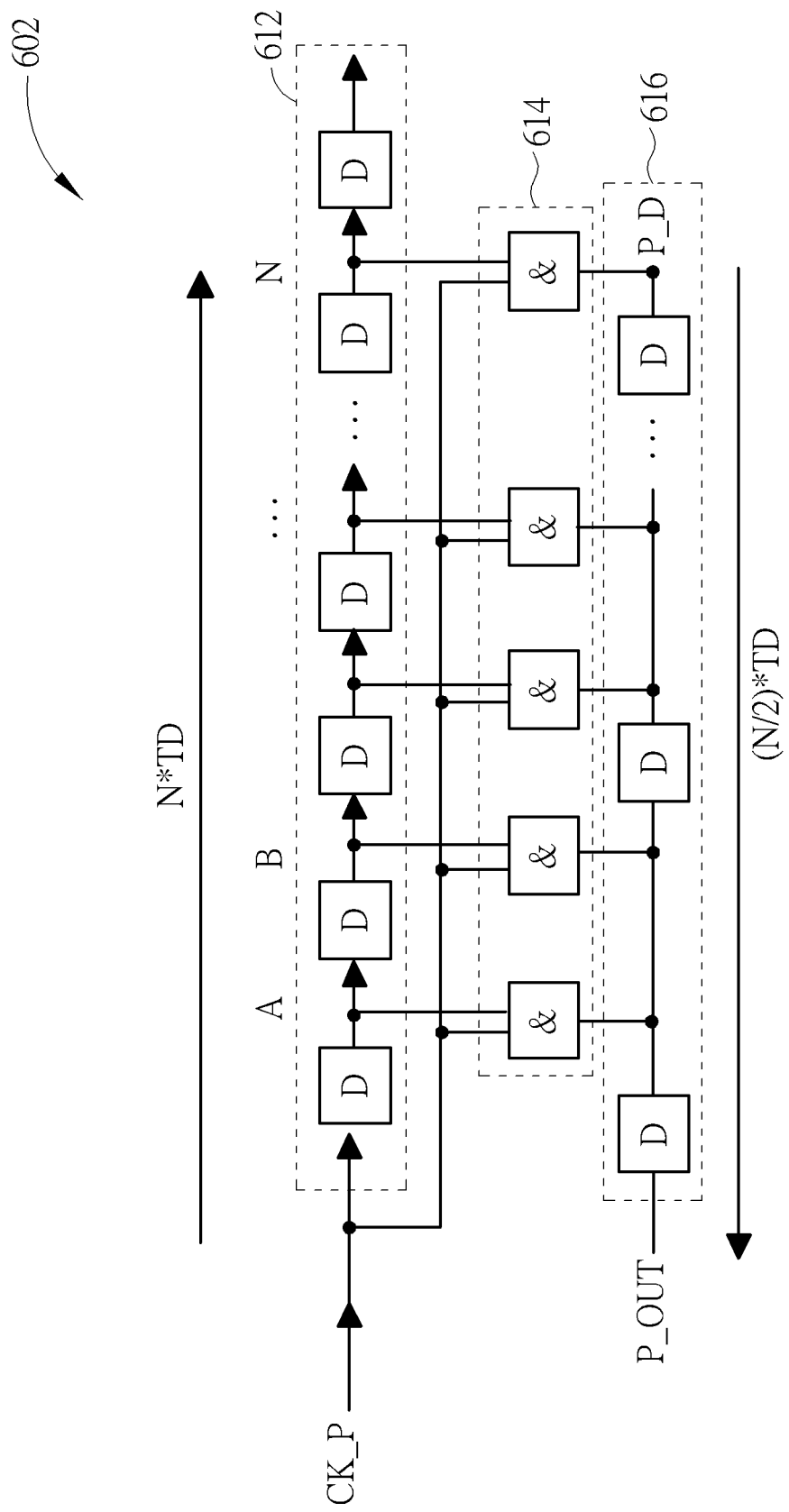
FIG. 7 illustrates a detailed implementation of the pulse interval detector.
Figure 8:
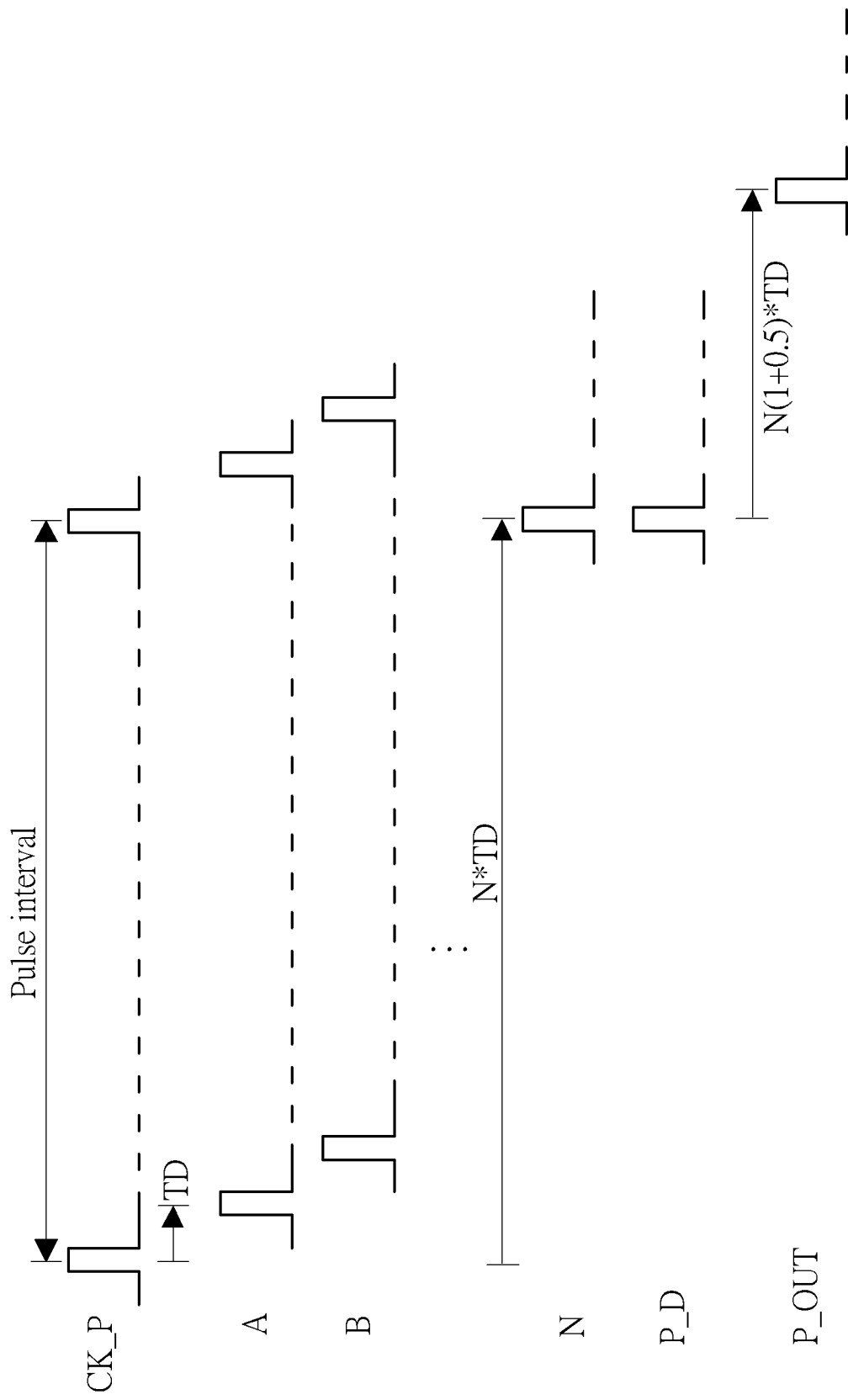
FIG. 8 is a waveform diagram of the delay pulses generated in the pulse interval detector.

FIG. 7 illustrates a detailed implementation of the pulse interval detector 602. As shown in FIG. 7, the first delay circuit 612, which receives the pulse signal CK_P from the pulse generator 102, includes at least N delay cells, where each delay cell has a delay time equal to TD. Therefore, the pulses in the pulse signal CK_P are delayed through the delay cells to generate delay pulses on the nodes A, B, C . . . N, as the waveforms shown in FIG. 8. According to the delay pulses, the control logic 614 may determine the number of delay cells in the first delay circuit 612 corresponding to the interval length of two adjacent pulses in the pulse signal CK_P. For example, after N delay cells with a total delay time N×TD in the first delay circuit 612, a pulse in the pulse signal CK_P is delayed to overlap the next pulse. Therefore, the control logic 614 will detect that the interval length of two adjacent pulses in the pulse signal CK_P corresponds to N delay cells. Since the delay time of each delay cell has a given value, the interval length of the pulses may be obtained.

In this embodiment, the control logic 614 includes a plurality of AND gates, wherein each AND gate performs an "AND" operation on the pulse signal CK_P and one of the delay pulses; hence, a pulse may be generated by the AND gate if the delay pulse overlaps the next pulse in the original pulse signal CK_P. In this way, the delay pulse generated after N delay cells may overlap the next pulse in the original pulse signal CK_P, and thus the corresponding AND gate may output a detection pulse P_D. Based on the detection pulse P_D output through the AND gate corresponding to the node N, the interval length of pulses may be determined to equal N×TD. Note that the structure of the control logic 614 described in this disclosure is one of various implementations of the present invention. In another embodiment, the control logic 614 may be composed of other types of logic gates, as long as the interval length of two adjacent pulses in the pulse signal CK_P may be found through the control logic 614.

In order to generate the output clock signal CK_OUT having a precise duty cycle 50%, the interval length of two adjacent pulses in the pulse signal CK_P should be divided by 2; that is, a period length equal to one half of the interval length of pulses should be obtained. This may be achieved by using the second delay circuit 616. Based on the detection result of the control logic 614, the detection pulse P_D has a delay time N×TD corresponding to N delay cells and the delay time N×TD is equal to the interval length of two adjacent pulses; hence, another delay time (N/2)×TD corresponding to one half of the interval length of pulses may be generated by delaying with N/2 delay cells. In this embodiment, the second delay circuit 616 may generate an output pulse P_OUT with a delay time equal to one half of the interval length of two adjacent pulses, i.e., (N/2)×TD. In order to achieve the half delay time, the number of delay cells included in the second delay circuit 616 may be one half of the number of delay cells included in the first delay circuit 612, and every two delay cells in the first delay circuit 612 may correspond to one delay cell in the second delay circuit 616, as shown in FIG. 7.

Please refer back to FIG. 6. The detection pulse P_D and the output pulse P_OUT generated in the pulse interval detector 602 are sent to the S-R latch 604, which may generate the output clock signal CK_OUT based on these pulses. Note that the interval between two detection pulses P_D equals a half cycle time of the input clock signal CK_IN, and thus the output clock signal CK_OUT having a double frequency may be generated. Also, the interval between the output pulse P_OUT and the detection pulse P_D equals (N/2)×TD, which means that the duty cycle of the output clock signal CK_OUT is 50%.

Figure 9:
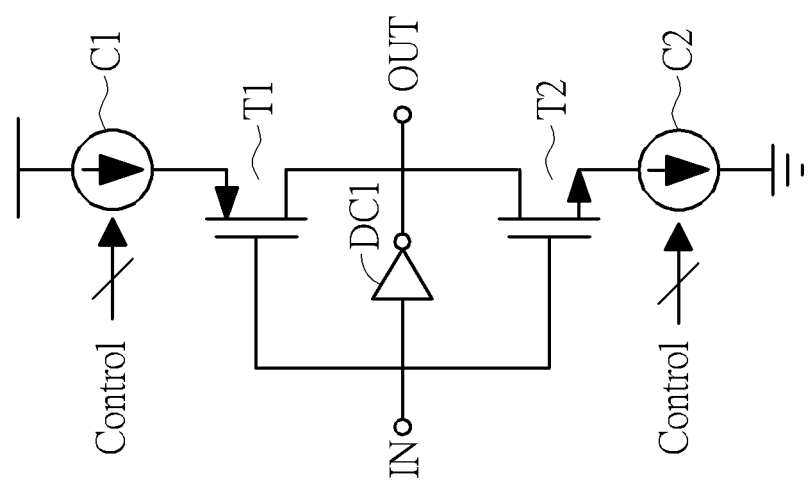
FIG. 9 illustrates an exemplary inverter that may be used to realize a delay cell.

The delay cells in the embodiments of the present invention may be implemented in any manners. For example, any logic gate, such as an AND gate, OR gate, NAND gate, NOR gate, Exclusive-NOR (XNOR) gate, Exclusive-OR (XOR) gate or inverter, may be used to realize the delay function, and the delay cells may be implemented with any of these logic gates or their combinations. FIG. 9 illustrates an exemplary inverter that may be used to realize a delay cell. Note that a delay cell may be implemented with even numbers of inverters connected in series.

As shown in FIG. 9, the inverter includes transistors T1 and T2, current sources C1 and C2, and a driving cell DC1. For the transistors T1 and T2, their drain terminals are coupled together and their gate terminals are coupled together, to realize the inverter structure. The current sources C1 and C2 are controllable current sources coupled to the source terminals of the transistors T1 and T2, respectively, and may receive the same or different control signals to output appropriate current values, in order to adjust the delay value according to the output currents. The driving cell DC1 may provide sufficient driving capability for improving the slew rate of the output signal of the inverter.

Therefore, the delay time of this inverter may be configurable and adjustable based on the control signals for the current sources C1 and C2. In an embodiment, the delay time may be adjusted to an appropriate value according to system requirements. For example, when the clock generator 10 is served to process a clock signal having a higher frequency, since the received clock signal has a shorter cycle, it is preferable to configure smaller delay time for each delay cell, in order to obtain the position of the detection pulse more precisely. When the clock generator 10 is served to process a clock signal having a lower frequency, since the received clock signal has a longer cycle and the interval between pulses is also longer, it is preferable to configure larger delay time for each delay cell, in order to find the pulse overlapping position under a limited number of delay cells in the delay circuit. The system may detect the clock frequency, and thereby generate appropriate control signals for the delay cell to achieve an appropriate delay time.

Please note that the present invention aims at providing a clock generator capable of generating an output clock with frequency multiplication. Those skilled in the art may make modifications and alterations accordingly. For example, in the pulse interval detector 602, the AND gates implemented in the control logic 614 may be replaced by other types of logic gates that are capable of pulse detection. In addition, in the DCC circuit 104 as shown in FIG. 6, the S-R latch 604 may be replaced by another type of flip-flop or any other combination of logic gates to achieve an appropriate frequency and the duty cycle 50% in the output clock signal CK_OUT. In another embodiment, the DCC circuit 104 may be implemented in other manner or have another circuit structure.

Figure 10:
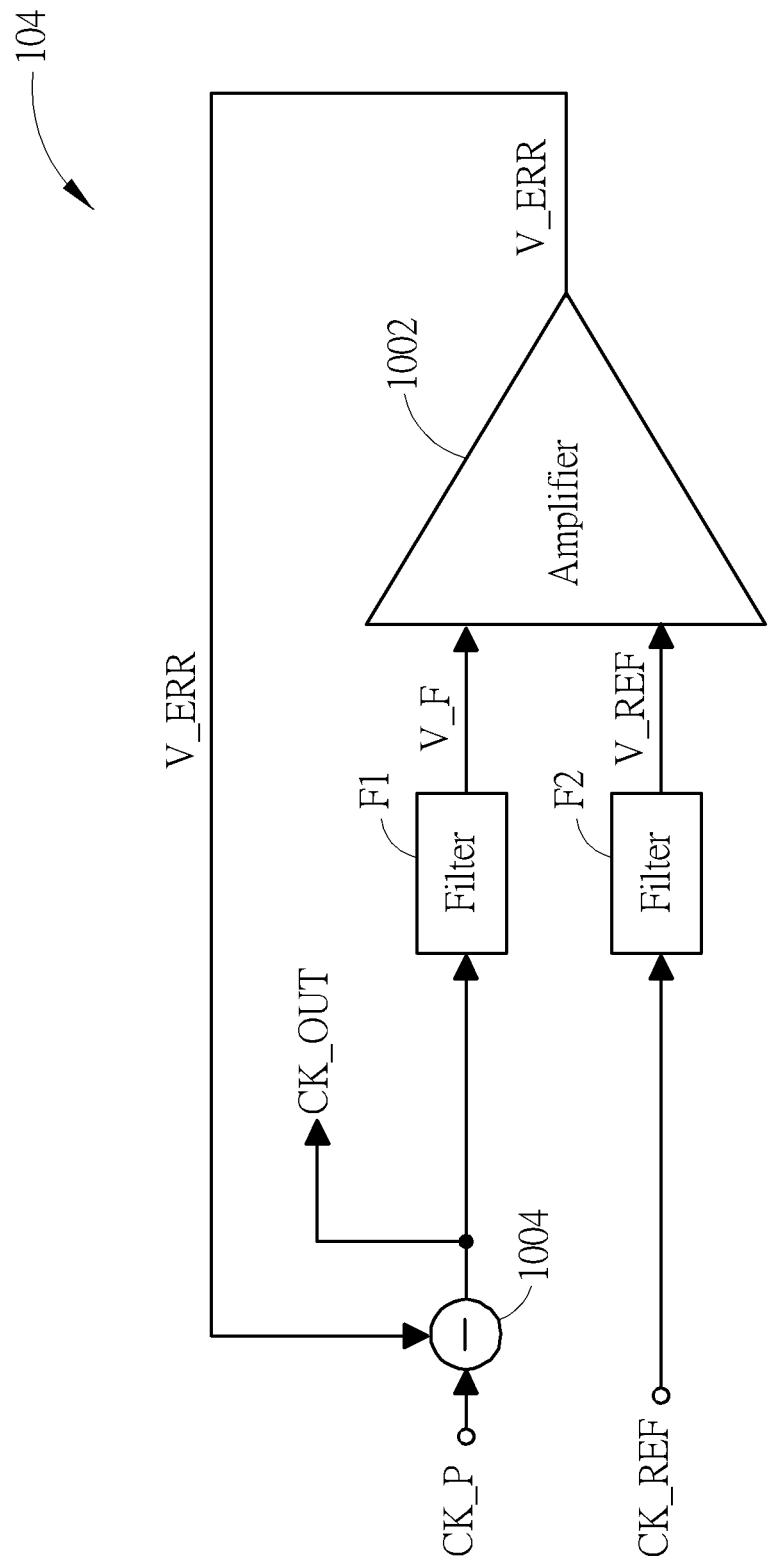
FIGS. 10-12 illustrate other detailed implementations of the DCC circuit.

Please refer to FIG. 10, which illustrates another detailed implementation of the DCC circuit 104, which may receive the pulse signal CK_P and adjust the duty cycle of the pulse signal CK_P to generate the output clock signal CK_OUT. As shown in FIG. 10, the DCC circuit 104 includes an amplifier 1002, filters F1 and F2, and an operator 1004. The filter F1 is coupled to a first input terminal of the amplifier 1002, and the filter F2 is coupled to a second input terminal of the amplifier 1002. The operator 1004 is coupled to the filter F1 and also coupled to the output terminal of the amplifier 1002. The filter F1 may receive the pulse signal CK_P and filter the pulse signal CK_P to generate a filter signal V_F. The filter F2 may receive a reference clock CK_REF and filter the reference clock CK_REF to generate a reference voltage V_REF. The amplifier 1002 thereby generates a feedback signal V_ERR according to the filter signal V_F and the reference voltage V_REF. The feedback signal V_ERR may be sent to the operator 1004 through the negative feedback connection. Therefore, the operator 1004 may generate the output clock signal CK_OUT according to the pulse signal CK_P and the feedback signal V_ERR, e.g., by subtracting the feedback signal V_ERR from the pulse signal CK_P, so as to adjust the duty cycle of the pulse signal CK_P in the feedback mechanism.

The amplifier 1002 with the negative feedback structure and the filters F1 and F2 may be used to modify the duty cycle of the pulse signal CK_P to be 50%. If the duty cycle is greater than 50%, the filter signal V_F generated through filtering (i.e., by the filter F1) may continuously increase. If the duty cycle is less than 50%, the filter signal V_F generated through filtering may continuously decrease. The feedback mechanism of the amplifier 1002 allows the duty cycle to reach 50%, where a constant filter signal V_F is achieved.

In this embodiment, the reference clock CK_REF may be a clock signal having a precise duty cycle 50%, and thus the reference clock CK_REF may be converted into a precise reference voltage V_REF through filtering (i.e., by the filter F2). In another embodiment, the reference voltage V_REF may be directly provided from an external voltage source or voltage generator. In such a situation, the filter F2 may be omitted. Alternatively, the reference voltage V_REF may still be filtered by the filter F2, in order to improve its stability.

Figure 11:
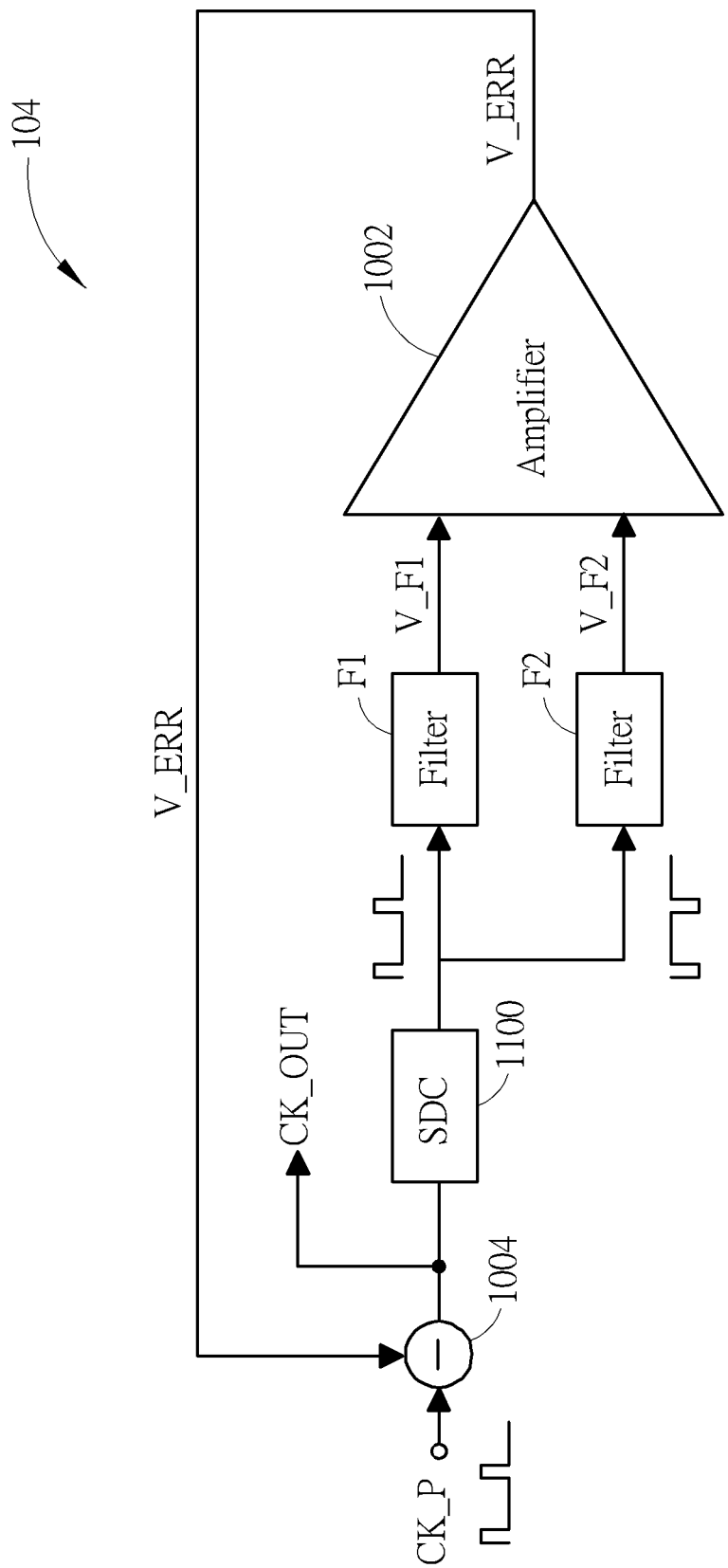

Please refer to FIG. 11, which illustrates a further detailed implementation of the DCC circuit 104. The circuit structure of the DCC circuit 104 shown in FIG. 11 is similar to that shown in FIG. 10, so signals and elements having similar functions are denoted by the same symbols. Their difference is that the DCC circuit 104 shown in FIG. 11 applies a single-to-differential converter (SDC) 1100 to convert the pulse signal CK_P into differential signals, instead of using an external reference clock or reference voltage. In this way, the differential signals may be filtered through the filters F1 and F2, respectively, to generate filter signals V_F1 and V_F2, which are sent to the two input terminals of the amplifier 1002. The amplifier 1002 thereby generates the feedback signal V_ERR according to the filter signals V_F1 and V_F2. With the negative feedback mechanism of the amplifier 1002, the duty cycle will reach 50% after adjustment or correction.

Figure 12:
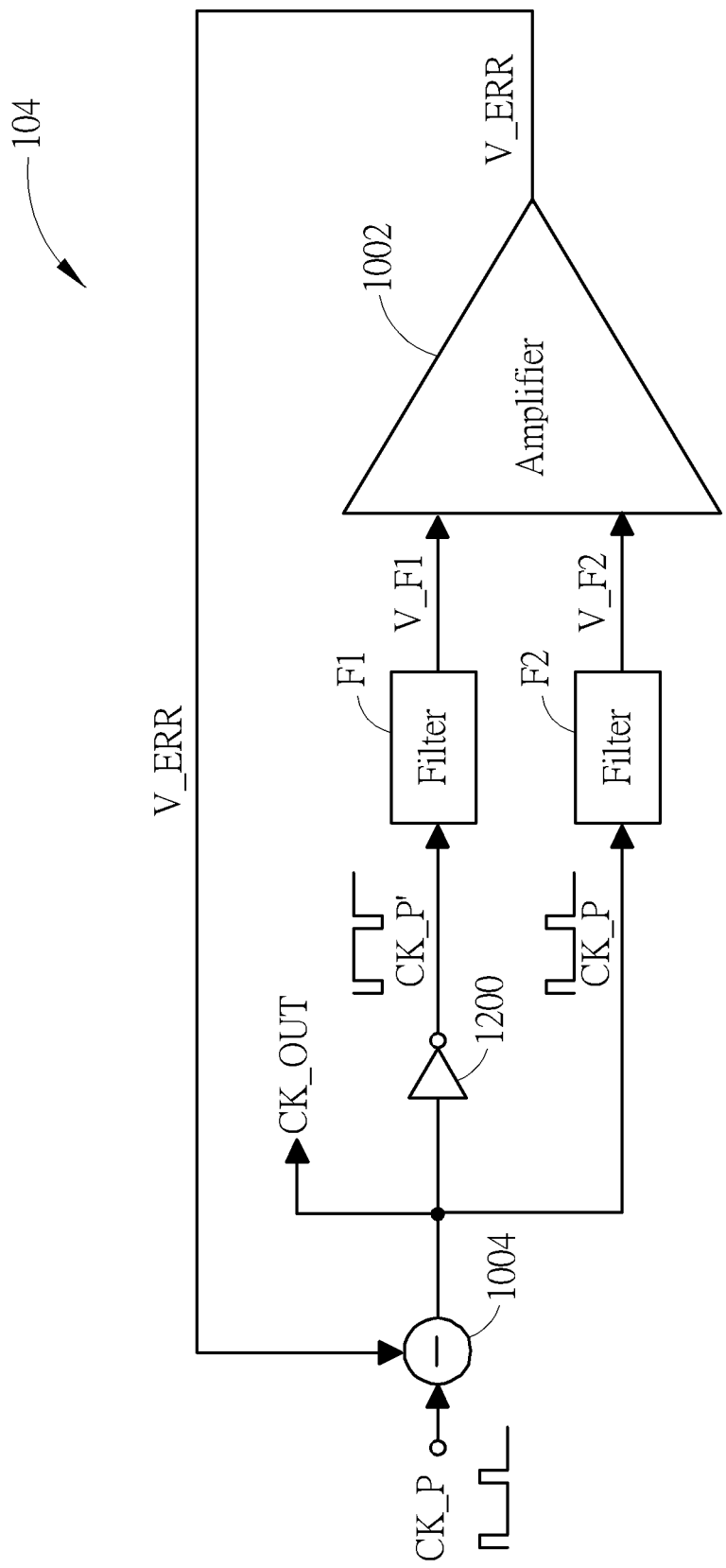

In another embodiment, the SDC 1100 may be replaced by an inverter 1200, as shown in FIG. 12, where similar duty cycle correction effects may be achieved. The inverter 1200 may generate an inverse pulse signal CK_P' based on the received pulse signal CK_P. The inverse pulse signal CK_P' and the pulse signal CK_P are filtered through the filters F1 and F2, respectively, and then sent to the input terminals of the amplifier 1002. Other detailed implementations and operations of the DCC circuit 104 shown in FIG. 12 are similar to those described above, and will not be repeated herein.

According to the implementations of the negative feedback structure, the duty cycle of the pulse signal CK_P may be corrected to 50% with reference to a reference voltage. FIG. 10 shows that the reference voltage V_REF may be generated by filtering a received reference clock, or may be received from an external circuit. In addition, FIG. 11 shows that the reference voltage may be generated through the SDC 1100, and FIG. 12 shows that the reference voltage may be generated through the inverter 1200. In such a situation, the usage of external reference clock or reference voltage may be omitted.

To sum up, the present invention provides a clock generator for frequency multiplication. The clock generator may include a pulse generator and a DCC circuit. According to the embodiments of the present invention, the pulse generator may generate a pulse signal based on the received input clock signal, where the pulse signal includes multiple pulses at the transition time of the input clock signal. The DCC circuit then adjusts the duty cycle of the pulse signal to be 50%, to generate the output clock signal. In an embodiment, the DCC circuit may use a pulse interval detector having a delay circuit to detect the interval of two pulses in the pulse signal, to find out the pulse interval and thereby control the pulse width to reach the duty cycle 50%. In another embodiment, the DCC circuit may use the feedback mechanism of an amplifier to correct the duty cycle of the pulse signal to be 50%, to generate the output clock signal. Further, in an embodiment, the clock generator composed of one pulse generator and one DCC circuit may be used to generate an output clock signal having a double frequency. In other embodiments, a plurality of frequency doublers, each having a pulse generator and a DCC circuit, may be connected in series to generate a clock generator capable of outputting clock signals having the frequency in a multiple of power of 2. As a result, the usage of PLL or DLL having complex circuit structures may be omitted, and thus the power consumption and circuit area may be saved in the clock generator.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A clock generator, comprising:
   a pulse generator, configured to receive an input clock signal and generate a pulse signal according to the input clock signal; and
   a duty cycle correction circuit, coupled to the pulse generator, configured to adjust a duty cycle of the pulse signal to generate an output clock signal;
   wherein a frequency of the output clock signal is a multiple of power of 2 of a frequency of the input clock signal;
   wherein the duty cycle correction circuit comprises:
      a pulse interval detector, configured to detect an interval length of two adjacent pulses in the pulse signal; and
      an S-R latch, coupled to the pulse interval detector, configured to generate the output clock signal according to a detection result of the pulse interval detector.

2. The clock generator of claim 1, wherein the pulse generator comprises:
   a delay cell, configured to generate a delay signal according to the input clock signal; and
   an Exclusive-OR gate, coupled to the delay cell, configured to generate the pulse signal by receiving the delay signal and the input clock signal.

3. The clock generator of claim 1, wherein the pulse interval detector comprises:
   a first delay circuit, configured to generate a plurality of delay pulses according to the pulse signal;
   a control logic, coupled to the first delay circuit, configured to determine a number of delay cells in the first delay circuit corresponding to the interval length of two adjacent pulses in the pulse signal according to the plurality of delay pulses; and
   a second delay circuit, coupled to the control logic, configured to generate an output pulse with a delay time corresponding to one half of the interval length.

4. The clock generator of claim 3, wherein a number of delay cells included in the second delay circuit is one half of the number of delay cells included in the first delay circuit.

5. The clock generator of claim 3, wherein a delay time of the delay cells is adjustable.

6. A clock generator, comprising:
   a pulse generator, configured to receive an input clock signal and generate a pulse signal according to the input clock signal; and
   a duty cycle correction circuit, coupled to the pulse generator, configured to adjust a duty cycle of the pulse signal to generate an output clock signal; wherein the duty cycle correction circuit comprises:
      a first filter;
      an operator, coupled to the first filter;
      an amplifier, comprising:
         a first input terminal, coupled to the first filter;
         a second input terminal; and
         an output terminal, coupled to the operator.

7. The clock generator of claim 6, wherein the first filter is configured to filter the pulse signal to generate a filter signal, and the amplifier is configured to generate a feedback signal according to the filter signal and a reference voltage.

8. The clock generator of claim 7, wherein the operator is configured to generate the output clock signal according to the pulse signal and the feedback signal.

9. The clock generator of claim 6, wherein the duty cycle correction circuit further comprises:
   a second filter, coupled to the second input terminal of the amplifier.

10. The clock generator of claim 9, wherein the second filter is configured to filter a reference clock to generate a reference voltage for the amplifier.

11. The clock generator of claim 6, wherein the duty cycle correction circuit further comprises:
    a second filter, coupled to the second input terminal of the amplifier; and
    a single-to-differential converter (SDC), coupled between the operator, the first filter and the second filter.

12. The clock generator of claim 11, wherein the SDC is configured to convert the pulse signal into a first differential signal and a second differential signal, the first filter is configured to filter the first differential signal to generate a first filter signal, the second filter is configured to filter the second differential signal to generate a second filter signal, and the amplifier is configured to generate a feedback signal according to the first filter signal and the second filter signal.

13. The clock generator of claim 6, wherein the duty cycle correction circuit further comprises:
    a second filter, coupled to the second input terminal of the amplifier; and
    an inverter, coupled between the operator and the first filter.

14. The clock generator of claim 13, wherein the inverter is configured to invert the pulse signal to generate an inverse pulse signal, the first filter is configured to filter the inverse pulse signal to generate a first filter signal, the second filter is configured to filter the pulse signal to generate a second filter signal, and the amplifier is configured to generate a feedback signal according to the first filter signal and the second filter signal.

15. A clock generator, comprising a plurality of frequency doublers connected in series, each of the frequency doublers comprising:
    a pulse generator, configured to receive an input clock signal and generate a pulse signal according to the input clock signal; and
    a duty cycle correction circuit, coupled to the pulse generator, configured to adjust a duty cycle of the pulse signal to generate an output clock signal;
    wherein the duty cycle correction circuit comprises:
       a pulse interval detector, configured to detect an interval length of two adjacent pulses in the pulse signal; and
       an S-R latch, coupled to the pulse interval detector, configured to generate the output clock signal according to a detection result of the pulse interval detector.

16. A clock generator, comprising a plurality of frequency doublers connected in series, each of the frequency doublers comprising:
  a pulse generator, configured to receive an input clock signal and generate a pulse signal according to the input clock signal; and
  a duty cycle correction circuit, coupled to the pulse generator, configured to adjust a duty cycle of the pulse signal to generate an output clock signal;
  wherein the duty cycle correction circuit comprises:
    a first filter;
    an operator, coupled to the first filter;
    an amplifier, comprising:
      a first input terminal, coupled to the first filter;
      a second input terminal; and
      an output terminal, coupled to the operator.

\* \* \* \* \*